United States Patent [19]

Naik et al.

[11] Patent Number: 5,077,141

[45] Date of Patent: Dec. 31, 1991

[54] HIGH STRENGTH NICKEL BASE SINGLE CRYSTAL ALLOYS HAVING ENHANCED SOLID SOLUTION STRENGTH AND METHODS FOR MAKING SAME

[75] Inventors: Subhash K. Naik, Milford; Vinod K. Nangia, Southbury, both of Conn.

[73] Assignee: Avco Corporation, Providence, R.I.

[21] Appl. No.: 443,573

[22] Filed: Nov. 29, 1989

Related U.S. Application Data

[63] Continuation-in-part of Ser. No. 247,920, Sep. 28, 1988, Pat. No. 4,885,216, which is a continuation-in-part of Ser. No. 678,802, Dec. 6, 1984, Pat. No. 4,677,035.

[51] Int. Cl.$^5$ ............... B32B 15/01; C22C 19/05; C22F 3/00
[52] U.S. Cl. .................... 428/680; 420/443; 420/444; 420/448; 148/404; 148/410; 148/428; 148/3; 428/678
[58] Field of Search ............... 428/680, 678; 148/404, 148/410, 428, 3, 20.3, 162; 420/443, 444, 448

[56] References Cited

U.S. PATENT DOCUMENTS

| | | | |
|---|---|---|---|
| 4,061,495 | 12/1977 | Selman et al. | 420/444 |
| 4,459,160 | 7/1984 | Meetham et al. | 148/404 |
| 4,677,035 | 6/1987 | Fiedler et al. | 428/680 |
| 4,853,044 | 8/1989 | Ford et al. | 148/404 |

Primary Examiner—R. Dean
Assistant Examiner—Margery S. Phipps
Attorney, Agent, or Firm—Perman & Green

[57] ABSTRACT

Disclosed are novel nickel base single crystal alloy compositions consisting essentially of, by weight, about 4.0-10.0% chromium, 1.5-6.0% cobalt, 1.0-12.0% molybdenum, 3.0-10.0% tungsten, 2.5-7.0% titanium, 2.5-7.0% aluminum, 3.0-10.0% tantalum, about 0.02%-1.5% of hafnium and/or about 0.02%-1.0% silicon, from about 0.02%-1.0% each of yttrium and/or lanthanum, from about 0.3% to about 8.0% rhenium; from about 0.2% to about 4.0% vanadium and/or from about 0.2% to about 4.0% niobium; from about 0.02% to about 3% platinum; from about 0 to about 1.0% boron, the balance nickel, and the balance nickel.

Methods of thermal treatment and coating of the novel alloys to enhance their mechanical properties are also disclosed, as are articles produced by such methods.

24 Claims, No Drawings

HIGH STRENGTH NICKEL BASE SINGLE CRYSTAL ALLOYS HAVING ENHANCED SOLID SOLUTION STRENGTH AND METHODS FOR MAKING SAME

BACKGROUND OF THE INVENTION

This application is a continuation-in-part of application Ser. No. 247,920, filed Sept. 28, 1988, to issue on Dec. 5, 1989 as U.S. Pat. No. 4,885,216, which is a continuation-in-part of application Ser. No. 678,802, filed Dec. 6, 1984, now U.S. Pat. No. 4,677,035, issued June 30, 1987.

1. Field of the Invention

This invention relates, in general, to novel and improved nickel base single crystal alloys and, in particular, to such alloys having the combined properties of oxidation/corrosion resistance, high strength at elevated temperatures, and improved high solid solution strength, high precipitation strength, and a broadened processing "window" between their gamma prime solvus or solutioning temperature and their incipient melting temperature. More specifically, the present invention relates to novel and improved nickel base single crystal alloys which retain their high temperature solid solution strength and mechanical properties after prolonged or repeated exposure to elevated temperatures, the single crystal alloys being capable of being cast into desired shapes, such as turbine blades, vanes and other parts used in high temperature gas turbine engines which exhibit excellent hot corrosion resistance. Even more specifically, the present invention relates to the above type of improved and novel nickel base single crystal alloys which can be heat treated to improve stress-rupture life of such alloys coated with conventional coatings with an accompanying heat treatment to impart high temperature oxidation/sulfidation resistance thereto without the formation of deleterious phases at the alloy/coating substrate interface.

2. Description of the Prior Art

Nickel base superalloys which have been commonly used over the years to fabricate gas turbine engine components typically contain, aside from certain levels of chromium, cobalt, aluminum, titanium and refractory metals (e.g., tungsten, molybdenum, tantalum and columbium) other elements which act as grain boundary strengtheners, such as carbon, boron and zirconium. These types of gas turbine blades are most commonly formed by casting, and the process most often utilized produces parts having equiaxed non-oriented grains. Since the high temperature properties or solid solution strength of metals are generally dependent upon grain boundary properties, efforts have been made to strengthen the boundaries of these alloys by addition of carbon, boron and/or zirconium, as discussed above, or to reduce or eliminate the grain boundaries transverse to the major stress axis of the part. One method of eliminating such transverse boundaries is directional solidification as described in U.S. Pat. No. 3,260,505. The effect of directional solidification is to produce an oriented microstructure of columnar grains whose major axis is parallel to the stress axis of the part and which has minimal or no grain boundaries perpendicular to the stress axis of the part.

A further extension of this concept is the utilization of single crystal parts in gas turbine blades as, for example, described in U.S. Pat. No. 3,494,709. The obvious advantage of the single crystal blade is the complete absence of grain boundaries and therefore the absence of these potential weak areas of a metallic structure. Thus, the mechanical properties of the single crystal are completely dependent upon the inherent mechanical properties of the material. While single crystal nickel base alloys are generally known, there exists a need for such alloys having a varied combination of properties including improved mechanical strength, especially over prolonged and/or repeated exposure to elevated temperatures, improved oxidation/corrosion resistance (especially at elevated temperatures) and the ability to be cast to desired shapes, such as turbine blades and parts, which are processed at elevated temperatures above their gamma prime solvus or solution temperature but below their incipient melting temperature. If this temperature "window" is too narrow the alloy cannot be used reliably for many commercial applications.

There exists in the patent literature many examples of nickel base superalloys and nickel base single crystal superalloys, methods for their fabrication and methods for their heat treatment. Examples of some of these prior art patents and the basic technology that they describe, is as follows:

In commonly assigned U.S. Pat. No. 4,677,035 there is described nickel base single crystal alloys which are improved, with regard to their strength and corrosion properties at elevated temperatures, by the addition of certain elements in certain amounts.

In commonly assigned U.S. Pat. No. 4,885,216 there are described nickel base single crystal alloys which represent an improvement over those of said U.S. Pat. No. 4,677,035 with respect to improved retention of high strength and long term phase stability, due to the addition of certain amounts of hafnium and silicon, and optionally having greater strength at elevated temperatures and hot corrosion resistance or greater resistance to oxidation/sulfidation at elevated temperatures due to the addition of certain amounts of yttrium, lanthanum and/or manganese.

Schweizer et al., U.S. Pat. No. 4,222,794, discloses a nickel base single crystal superalloy for use at elevated temperatures having a restricted composition consisting of 4.5-6.0% chromium, 5.0-5.8% aluminum, 0.8-1.5% titanium, 1.7-2.3% molybdenum, 4.0-6.0% tungsten, 5.5-8.0% tantalum, 1.0-5.0% rhenium, 0.2-0.6% vanadium, 0-7.0% cobalt and the balance nickel This patent also discloses a method of heat treating the alloys described therein at a specific temperature range. Although the Schweizer et al patent discloses a single crystal alloy, said alloy differs chemically from the alloy of the present invention. For example, the alloy of the present invention is significantly higher in chromium content, titanium content and titanium to aluminum ratio, and does not contain rhenium and vanadium.

Gell et al., U.S. Pat. No. 4,116,723, discloses single crystal nickel base super alloys free from intentional additions of cobalt, boron, and zirconium. Gell at al. discusses the avoidance of the development in the single crystal alloys of deleterious phases after long term exposure at elevated temperatures (i.e., alloy instability), the phases being of two general types, sigma and mu. Sigma is undesirable because of its brittle nature while mu is undesirable because the phase ties up large amounts of the refractory solid solution strengtheners thus weakening the remaining alloy phases. The sigma and mu phases are termed TCP phases for topologically closed packed phases and one of their common properties is that they all contain cobalt. Gell et al. eliminates cobalt in the claimed single crystal nickel base alloys to inhibit the formation of TCP phases therein. Unexpectedly, the presence of cobalt in the single nickel base alloys of the present invention does not induce the formation of TCP phases. Also, the ratio of titanium to aluminum disclosed by Gell et al. is lower than that in the alloy of the present invention. While U.S. Pat. No. 4,116,723 relates to heat treatment of single crystal alloys, precipitation-hardened alloys having the high temperature mechanical properties of the instant invention (e.g., retention of high temperature properties after prolonged or repeated exposure to elevated temperature) are not obtained.

Duhl et al. U.S. Pat. No. 4,402,772 discloses single crystal superalloy casting compositions, and superalloy coatings applied thereto. The casting compositions consist essentially of 3.5-7% tantalum, 7.4-11% chromium, 4-6% cobalt, 0.6-1.8% titanium, 0-2.5% molybdenum, 6-12% tungsten, 4.5-6% aluminum, 0.05-0.5 hafnium and balance nickel. Other metals, such as rhenium and vanadium, are acknowledged as known superalloy additives but are excluded by Duhl et al.

Harris et al. U.S. Pat. No. 4,582,548 discloses single crystal superalloy casting compositions having no hafnium except in the form of trace amounts thereof.

Duhl et al U.S. Pat. No. 4,801,513 discloses single crystal superalloy casting compositions consisting essentially of 5-18% chromium, at least 5% of aluminum or titanium, at least 5% of molybdenum, tungsten, tantalum, columbium, rhenium or silicon, and the balance nickel. Rhenium is an optional ingredient and its function is not disclosed.

There are many patents disclosing various single crystal superalloy compositions having different specific ingredients and proportions to provide specific properties of the types required by the particular application in which the superalloys are to be used. Some ingredients, and/or proportions thereof, impart properties which may be undesirable for certain applications, and certain amounts of additive materials or metals may not impart the same properties to one composition as they do to another, because of the different properties of the base alloys.

Among the disadvantages of the prior known single crystal superalloy casting compositions are their limited solid solution strength, their limited precipitation strength, due to low gamma prime content, and their narrow heat treatment "window" which limits the temperatures at which they can be manufactured or processed.

SUMMARY OF THE INVENTION

It is an object of the present invention to provide novel and improved single crystal superalloy compositions which are devoid of the above-noted limitations.

It is another object of this invention to provide single crystal nickel base superalloy compositions which have high solid solution strength and exhibit long term phase stability after prolonged and/or repeated exposure to elevated temperatures over a relatively wide range.

It is another object of this invention to provide novel and improved single crystal nickel base superalloy compositions which in addition to their high solid solution strength at elevated temperatures also exhibit excellent oxidation/corrosion resistance at elevated temperatures.

It is a further object of this invention to provide novel and improved heat-treated, coated alloy compositions with enhanced mechanical properties.

It is still another object of this invention to provide improved single crystal superalloy compositions which are compatible with conventional high temperature coatings, such as diffused aluminides, and do not exhibit deleterious TCP phases at the coating/single crystal alloy interface.

It is yet a further object of this invention to provide novel and improved high strength, single crystal nickel base alloys which may be solution treated and processed over a wider range of temperatures, without incipient melting, and to be cast to desired shapes, such as turbine blades, and other parts that can be used in high temperature gas turbine engines.

It is yet another objective of this invention to provide novel and improved nickel base single crystal alloy compositions having improved solid solution strength and precipitation strength plus exceptional coated oxidation and sulfidation resistance including hot corrosion resistance and high strength at elevated temperatures.

The foregoing objects, and others, are accomplished in accordance with this invention, generally speaking, by providing novel nickel base single crystal alloy composition consisting essentially of, by weight, about 4.0% to about 10.0% chromium; about 1.5% to about 6.0% cobalt; about 1.0% to about 12.0% molybdenum; about 3 0% to about 10.0% tungsten; about 2.5-7.0% titanium; about 2.5% to about 7.0% aluminum; about 3.0% to about 10.0% tantalum; about 0.002% to about 1.5% hafnium from about 0.02% to about 1.0% silicon; from about 0.02% to about 1.0% yttrium and/or from about 0.02% to about 1.0% lanthanum; from about 0.3% to about 8% rhenium, from about 0.2% to about 4% vanadium and/or from about 0.2% to about 4% niobium; from about 0.02% to about 3% platinum; 0 to about 1.0% boron, the balance nickel.

In accordance with still another embodiment of the present invention the strength (i.e., stress-rupture life) of the single crystal superalloy compositions described above is improved by a heat treatment process which comprises the steps of (i) providing a nickel base alloy composition as described above; (ii) melting and directionally solidifying the composition to produce a single crystal alloy; (iii) solution heat treating the alloy at a temperature of between about 2330° F. and about 2430° F. for about 2 to about 6 hours; (iv) rapidly cooling the alloy at a rate greater than about 120° F. per minute from the solution temperature to about 1600° F.; and (v) subjecting the alloy to a double aging heat treatment by (a) heat treating the alloy at a temperature of between about 1975° F. and 2050° F. and holding the alloy within this temperature range for about 2 to about 6 hours and then (b) heat treating the alloy at a temperature of about 1600° F. to about 1800° F. and holding the alloy within this temperature range for about 16 to about 22 hours.

The novel nickel base single crystal alloy compositions of the present invention can be coated with conventional coatings such as MCrAlY overlay coatings and aluminide coatings with an accompanying heat treatment to impart further high temperature oxidation/sulfidation resistance to the alloy compositions without the formation of deleterious TCP phases at the single crystal alloy/coating interface.

DETAILED DESCRIPTION OF THE INVENTION

Unless otherwise stated, all percent figures stated herein are percent by weight.

According to the present invention, novel and improved nickel base single crystal superalloy compositions having both high solid solution strength and precipitation strength at elevated temperatures (including when there is prolonged or repeated exposure to such elevated temperatures) while retaining the significant improvement in hot corrosion resistance (improved oxidation/sulfidation resistance at elevated temperatures) are provided which consist essentially of about 4.0% to about 10.0% chromium; about 1.5% to about 6.0% cobalt; about 1.0% to about 12.0% molybdenum; about 3.0% to about 10.0% tungsten; about 2.5% to about 7.0% titanium; about 2.5% to about 7.0% aluminum; about 3.0% to about 10.0% tantalum; about 0.02% to about 1.5% hafnium and/or from about 0.02% to about 1.0% silicon; from about 0.01% to about 1.0% yttrium and/or from about 0.01% to about 1.0% lanthanum; from about 0.3% to about 8% rhenium, from about 0.2% to about 4% vanadium and/or from about 0.2% to about 4% niobium; from about 0.02% to about 3% platinum; 0 to about 1.0% boron, the balance nickel.

Examples of some preferred compositions of the present invention consist essentially of about 4.0% to about 7.9% chromium; about 2.5% to about 5.0% cobalt; about 2.0% to about 6.0% molybdenum; about 5.0% to about 9.0% tungsten; about 2.5% to about 6.0% titanium; about 3.0% to about 6.0% aluminum; about 4.0% to about 9.0% tantalum; about 0.05% to about 0.5% hafnium and/or about 0.02% to about 0.3% silicon; about 0.02% to about 0.4% yttrium and/or about 0.02% to about 0.4% lanthanum; about 1.0 to about 6.0% rhenium; from about 0.2% to about 1.5% vanadium and/or from about 0.2% to about 1.5% niobium; from about 0.2% to about 1.5% platinum; from about 0 to about 0.3% boron, and the balance nickel.

The present novel and improved nickel base single crystal alloy compositions have improved hot corrosion resistance (improved oxidation/sulfidation resistance at elevated temperatures) due to the presence of hafnium and/or silicon.

The excellent oxidation and corrosion resistance of the present alloy compositions is due to improved oxide scale integrity and stability which improves the stability of the oxide formed at high temperatures. This involves minor additions of Hf and Si either singly or in combination. Additions preferably are on the order of up to about 0.6%. In this approach it is necessary to avoid the formation of excessive quantities of low melting compounds and thus not adversely affect the broadened solutioning temperature range or "window", or the strength levels of the base line alloy.

The new and improved properties of the present single crystal superalloy compositions over related compositions of the prior art result from critical additions of rhenium, vanadium and/or niobium, platinum, yttrium and/or lanthanum.

Rhenium, a very rare metal from group VII of the periodic table, has been found to increase the solid solution strength of the present superalloys and is the main ingredient responsible for providing high strength of the solid solution of the superalloy at temperatures between the gamma prime ($\gamma'$) solvus temperature, i.e., the heat-treatment temperature at which all of the gamma prime strengthening materials precipitate and some of the eutectic materials become dissolved to form a solid solution, and the higher incipient melting temperature at which the superalloy liquifies. The greater the gap between the gamma prime solvus temperature, generally between about 2000° F. and 2430° F., and the incipient melting temperature, generally between about 2400° F. and 2600° F., the wider the window or temperature range within which the superalloy can be manufactured or processed without melting. However it is necessary that the solid solution has sufficient strength to maintain its integrity at temperatures within said gap or window to enable it to be cast or otherwise formed into a desired shape and to retain such shape until cooled.

Vanadium and niobium are group Vb metals and perform complimentary functions in increasing the strength and widening the gap between the gamma prime solvus temperature and the incipient melting temperature of the present superalloys. Niobium increases the gamma prime content of the alloy and provides precipitation strength during the solution heat treatment. Vanadium reduces the gamma prime solvus temperature without increasing the incipient melting temperature, thereby widening the gap or window therebetween.

Platinum, a noble metal, is quite inert but has been found to increase the oxidation resistance of the superalloy, particularly at elevated temperatures, without reacting with the core materials. Thus, the addition of platinum permits the content of yttrium and/or lanthanum, materials which are also added to impart oxidation resistance, to be reduced to a preferred content between about 0.05% up to 0.4% since yttrium and lanthanum are reactive with the core materials, particularly when used in larger amounts.

The compositions of the present invention are produced in single crystal form by known casting techniques (melting and directionally solidifying to produce a single crystal material). Thereafter the single crystal alloy compositions are typically heat treated by solution heat treating the single crystal alloy material at a gamma prime solvus temperature of between about 2250° F. and about 2430° F. for about 2 to about 6 hours. It is preferred to solution heat treat for about 3 hours in a vacuum atmosphere. In accordance with a further embodiment of the invention as described herein, the compositions may be subject to either a single or multiple solution heat treatment. A preferred double step solution heat treatment comprises the steps wherein the material is (i) subject to a solution heat treatment at a gamma prime solvus temperature of about 2250° F. for about 3 hours, (ii) rapidly cooled, and (iii) subject to a second solution heat treatment at a gamma prime solvus temperature of about 2350° F. to 2430° F. for about 3 hours. After solution heat treating, the material is rapidly cooled, preferably at a rate greater than about 120° F. per minute from the solution heat treating temperature to a temperature of about 1600° F. The rapid cooling is preferably accomplished by a means such as a gas fan quench within the furnace. Typically, a gas fan quenching means is used which introduces a large volume of a neutral gas, such as for example helium, argon, etc., to lower the furnace temperature rapidly with fans aiding the circulation of the gas to attain rapid cooling. Generally speaking, the faster cooling rates help to attain better properties. Typically, the preferred cooling rates in accordance with the present invention are greater than 120° F./minute from the solution heat treating temperature to a temperature of about 1600° F. The nickel base single crystal alloys are given a solutioning heat treatment to homogenize the constitutive elements for higher strength properties, and then aged or double aged in order to provide the maximum amount of ordered precipitate phase for superior strength. In accordance with the preferred features of the present invention the material after rapid cooling would be subject to an aging treatment, preferably a double aging treatment by (i) heat treating the material at a temperature of between about 1975° F. and 2050° F. and holding the material at this temperature for about 2 to 6 hours, and then (ii) heat treating the material at a temperature of about 1600° F. to about 1800° F. and holding the material at this temperature for about 16 to about 22 hours. It is also preferred that the first aging heat treatment is performed at a temperature of about 1975° F. and held at this temperature for about 4 hours and more preferably in an atmosphere such as argon. The second aging process is preferably performed at a temperature of about 1600° F. for about 20 hours and more preferably in an atmosphere such as argon or air.

By practicing the heat treatment cycle just described, very fine (less than 1 µm size) gamma prime particles can be formed in the gamma matrix thereby improving the creep resistance of the alloy.

The single crystal nickel base alloy compositions of the present invention while possessing both improved high strength at prolonged or repeated exposure to high temperatures and improved corrosion resistance at elevated temperatures, can further improve their resistance to susceptibility to the accelerated corrosive effect of the hot gas environment in which components fabricated from the alloys described herein are exposed to when used in gas turbines. To accomplish this additional improvement and further prevent unacceptably rapid oxidation and corrosion rates, protective coatings of the type normally employed in the gas turbine industry can be applied to single crystal nickel base alloy substrates of the present invention without the formation of deleterious TCP phases at the coating/substrate interface. Diffused aluminide coatings and MCrAlY overlay coatings are examples of coating materials which can be successfully employed as protective coatings for the single crystal nickel base alloy of the present invention.

Aluminide coatings are produced by diffusion of aluminum into the single crystal nickel base alloy substrate and the reaction of aluminum with the alloy to produce intermetallic compounds. In high temperature use, the surface of the alloy substrate develops an alumina layer which acts as a barrier to further oxidation of the coated component. MCrAlY coatings are themselves oxidation resistant and do not depend upon any reaction with or diffusion into a substrate. In MCrAlY coatings in use today, M represents primarily nickel or cobalt alone or mixtures of nickel or cobalt with up to about 9 percent molybdenum, and preferably about 1 to 3 percent molybdenum wherein the metal or metals represented by M comprise about 30 to 75 percent by weight of the coating, chromium comprises about 10 to about 40 percent by weight of the coating, aluminum comprises about 5 to about 20 percent by weight of the coating and yttrium comprises about 0.1 to about 1.0 percent by weight of the coating. Optionally small amounts, e.g., about 0.1 to about 10 percent by weight of a metal selected from Hf, Si, Mn, Pt and mixtures thereof may also be incorporated in the MCrAlY coating.

The aluminide coating may be conveniently deposited on the single crystal nickel base alloy substrate by a pack method. In this method, the substrate to be coated is thoroughly cleaned to remove foreign debris from the substrate which is then packed in a powdered NiAl alloy containing about 22 to about 40% by weight aluminum. The pack is heated in a vacuum furnace with the pack held at about 1900° to about 2050° F. for between about 2 to about 8 hours whereby a coating thickness of between about 40 to about 120 µm is developed on the substrate surface.

The MCrAlY overlay coating is applied to the single crystal nickel base alloy substrate at a thickness varying from about 15 to about 200 µm and preferably about 20 to about 70 µm. Among the other methods by which the MCrAlY overlay coating may be applied to the substrate include conventional physical vapor deposition processes as, for example, low pressure plasma spray (LPPS) or sputtering. A diffusion cycle of about 1900° to 2050° F. for 2 to 4 hours is used after application of the coating.

Vapor phase aluminide coatings are similar in composition to the pack aluminides. However, the process is slightly different. Whereas in the pack aluminides the parts are embedded in the pack mixture, in the vapor phase the packs are placed or suspended above the pack mixture and additional carrier flow gases, e.g., argon, are added to pass through the pack material to carry the aluminum halide gas towards the heated component to react with it and form NiAl (which is the pack or vapor aluminide coating composition).

An advantage of the vapor phase coating is that it can be deposited at the aging cycle of the method described herein, i.e., 1975° F. It is therefore possible in accordance with the invention described herein to combine the coating cycle with the heat treatment cycle.

Sputtering is a coating process wherein the particles are liberated from a target surface composed of the MCrAlY alloy by bombardment of energetic ions and then accelerated towards the single crystal nickel base alloy substrate under the influence of an applied high voltage in a gas at $10^{-1}$ Torr or less to deposit the required coating. It is preferred, that the MCrAlY coating be applied to the nickel base single crystal alloy substrate of the present invention by means of a LPPS process.

In a LPPS process, controlled amounts of the coating powder alloy are introduced in the plasma stream of the spray gun. The powder becomes molten and is projected at a very high velocity on the preheated (in the order of about 1,750° F.) surface of the part to be coated which is contained within a vacuum chamber under pressure of about $10^{-4}$ Torr or greater. Upon impact against the surface to be coated, the coating alloy particles transfer thermal and mechanical energy to the substrate, producing forces which favor fusing and bonding, thus producing a dense and adherent coating. Deposition time is controlled to obtain a coating thickness of between about 0.070 to about 120 m and an acceptable density of 98%. Specimens are glass bead peened at 6-7 N intensity and diffusion heat treated at 1,065° C. for about 4 hours.

The temperatures generally employed to diffuse aluminide and MCrAlY coatings, e.g., 1900°-2050° F. do not deleteriously effect the physical properties of the nickel base single crystal alloys of the present invention which are subjected to such coating processes, such temperatures having been found to be compatible with the aging kinetics of the alloy substrate.

The present invention may be better understood through reference to the following example which is meant to be illustrative of some of the embodiments of the present invention.

EXAMPLE 1

A series of single crystal nickel base alloy compositions (hereinafter identified as alloys (A-D as shown in Table I) were cast by differential solidification and cooled to room temperature. Alloy A are examples of single crystal nickel base alloys not having the specific improvements in accordance with the present invention. Alloys C and D are examples of the single crystal alloys that incorporate embodiments of the present invention.

TABLE I*

| Elements | Alloys | | | |
|---|---|---|---|---|
| | A (1029 NA) | B(1029IA1) | C | D |
| Cr | 10.6 | 10.6 | 6.0 | 5.5 |
| Co | 2.52 | 2.52 | 2.52 | 5.0 |
| Mo | 0.92 | 0.92 | 4.0 | 0.92 |
| W | 6.5 | 6.5 | 4.0 | 6.5 |
| Ti | 3.68 | 3.68 | 3.2 | 3.2 |
| Al | 4.15 | 4.15 | 4.6 | 4.15 |
| Ta | 4.42 | 4.42 | 4.42 | 4.42 |
| Hf | 0.2 | 0.2 | 0.1 | 0.1 |
| Si | 0.1 | 0.1 | 0.05 | 0.05 |
| B | — | — | — | — |
| Y | — | 0.1 | 0.02 | 0.02 |
| La | — | 0.1 | 0.02 | 0.02 |
| Re | — | — | 3.0 | 6.0 |
| V | — | — | — | 0.8 |
| Nb | — | — | 0.8 | — |
| Pt | — | — | 0.5 | 0.5 |
| Ni | Bal | Bal | Bal | Bal |

*Figures in this Table are all percent by weight.

Alloys A-D were subject to a solutioning heat treatment as shown in Table II to homogenize the constitutive elements for subsequent higher strength after aging. The solution heat treatments for Alloys C and D were conducted by heating the alloys between 2330° F.-2430° F. for 3 hours in a vacuum atmosphere and then rapidly cooling the alloys by a gas fan quench within the furnace using a neutral gas. The alloys were cooled at a rate greater than 120° F./min from the solutioning temperature to about 1600° F. Table II illustrates nominal solutioning temperatures that can be used for Alloys A-D.

TABLE II

| Alloy | Solution Heat Treatment Temp. (°F.) | Incipient Melting Temp. (°F.) | Time At Solution (hours) |
|---|---|---|---|
| A | 2350 | 2375 | 3 |
| B | 2330 | 2375 | 3 |
| C | 2400 | 2450 | 3 |
| D | 2400–2415 | 2450 | 3 |

To illustrate different features of the present invention, three different heat treatments are given. In each heat treatment the solution treatment is fixed for an alloy based on its temperature capabilities. Heat treatment (1) comprises solutioning at 2350° F. for hours in a vacuum atmosphere followed by rapid cooling at a rate greater than 120° F./min. to 1600° F. by a gas fan quench, subjecting the alloy to a first aging heat treatment at 1975° F. for 4 hours in an argon atmosphere and then subjecting the alloy to a second aging heat treatment at 1600° F. for 20 hours in an argon or air atmosphere. Heat treatment (2) is the same as heat treatment (1) except the solution heat treatment temperature for (2) is 2330° F. Heat treatment (3) illustrates a method for further improving stress-rupture properties by solutioning the alloy two times prior to aging. Heat treatment (3) comprises the steps of (i) solutioning the alloy at 2330° F. for 3 hours in a vacuum atmosphere followed by rapid cooling at a rate greater than 120° F./min. to 1600° F. by a gas fan quench, (ii) solutioning the alloy at 2350° F. for 3 hours in a vacuum atmosphere followed by rapid cooling at a rate greater than 120° F./min to 1600° F. by a gas fan quench, (iii) subjecting the alloy to a first aging heat treatment at 1975° F. for 4 hours in an argon atmosphere, and then (iv) subjecting the alloy to a second aging heat treatment at 1600° F. for 20 hours in an argon or air atmosphere.

It is to be understood that the above described embodiments of the invention are illustrative only and that modifications throughout may occur to those skilled in the art. Accordingly, this invention is not to be regarded as limited to the embodiments disclosed herein, but is to be limited as defined by the appended claims.

What is claimed is:

1. A single crystal alloy composition having improved oxidation/corrosion resistance, high strength at elevated temperatures and improved solid solution strength consisting essentially of, by weight, about 4.0% to about 10.0% chromium; about 1.5% to about 6.0% cobalt; about 1.0% to about 12.0% molybdenum; about 3.0% to about 10.0% tungsten; about 2.5% to about 7.0% titanium; about 2.5% to about 7.0% aluminum; about 3.0% to about 10.0% tantalum; at least one element selected from the group consisting of from about 0.02% to about 1.5% of hafnium and from about 0.02% to about 1.0% of silicon; from about 0.02% to about 1% of at least one element selected from the group consisting of yttrium and lanthanum; from about 0.3% to about 8.0% rhenium; from about 0.2% to about 4.0% of at least one element selected from the group consisting of vanadium.

2. The composition of claim 1 consisting essentially of, by weight, about 4.0% to about 7.9% chromium; about 2.5% to about 5.0% cobalt; about 2.0% to about 6.0% molybdenum; about 5.0% to about 9.0% tungsten; about 2.5% to about 6.0% titanium; about 3.0% to about 6.0% aluminum; about 4.0% to about 9.0% tantalum; at least one element selected from the group consisting of from about 0.05% to about 0.5% hafnium and from about 0.02% to about 0.3% silicon; about 0.05% to about 0.4% of at least one element selected from the group consisting of yttrium and lanthanum; from about 1.0% to about 6.0% rhenium; from about 0.2% to about 1.5% of at least one element selected from the group consisting of vanadium and niobium; from about 0.2% to about 1.5% platinum; from about 0 to 0.3% boron, and the balance nickel.

3. The composition of claim 1 containing both yttrium and lanthanum.

4. The composition of claim 3 comprising up to about 0.4% yttrium and up to about 0.4% lanthanum.

5. The composition of claim 1 comprising from about 1.0% to about 6.0% rhenium.

6. The composition of claim 1 comprising from about 0.2% to about 4.0% vanadium.

7. The composition of claim 1 comprising from about 0.2% to about 4.0% niobium.

8. The composition of claim 1 comprising from about 0.2% to about 1.5% platinum.

9. An article of manufacture comprising a substrate material fabricated from the composition of claim 1, the substrate being coated with a layer of an aluminide deposit to impart improved high temperature oxidation/corrosion resistance thereto.

10. The article of claim 9 wherein the aluminide deposit is prepared from a NiAl alloy which contains from about 25 to about 40 percent by weight aluminum, the balance being nickel.

11. An article of manufacture comprising a substrate material fabricated from the composition of claim 1, the substrate being coated with an overlay coating to impart improved high temperature oxidation/corrosion resistance thereto, the overlay coating composition having the general formula MCrAlY wherein M is a solid solution of metal selected from the group consisting of nickel, cobalt, and mixtures of nickel and cobalt with molybdenum wherein the metals represented by M comprise 30 to 75 percent by weight of the coating; chromium comprises about 10 to about 40 percent by weight of the coating; aluminum comprises about 5 to about 20 percent by weight of the coating and yttrium comprises about 0.1 to about 1.0 percent by weight of the coating.

12. A method for producing a heat-treated single crystal alloy material having improved oxidation/corrosion resistance and improved solid solution strength comprising:
  (a) providing a composition consisting essentially of, by weight, about 4.0% to about 10.0% chromium; about 1.5% to about 6.0% cobalt; about 1.0% to about 12.0% molybdenum; about 3.0% to about 10.0% tungsten; about 2.5% to about 7.0% titanium; about 2.5% to about 7.0% aluminum; about 3.0% to about 10.0% tantalum; about 0.02% to about 1.0% of at least one element selected from the group consisting of hafnium and silicon; from 0.01 to 1% of at least one element selected from the group consisting of yttrium and lanthanum; from about 0.3% to about 8.0% rhenium; from about 0.2% to about 4.0% of at least one element selected from the group consisting of vanadium and niobium; from about 0.02% to about 3% plantinum; from about 0 to about 1.0% boron, the balance nickel.
  (b) melting and directionally solidifying the composition to produce a single crystal alloy material;
  (c) solution heat treating the material at a temperature of between about 2330° F. and about 2430° F. for about 2 to about 6 hours;
  (d) rapidly cooling the material at a rate greater than about 120° F. per minute from the solution temperature to about 1600° F.; and
  (e) subjecting the material to a double aging heat treatment by (i) heat treating the material at a temperature of between about 1975° F. and 2050° F. and holding the material at this temperature for about 2 to about 6 hours and then (ii) heat treating the material at a temperature of between about 1600° F. and 1800° F. and holding the material at this temperature for about 16 to about 22 hours.

13. The method of claim 12 wherein said solution heat treatment of step (c) is performed for about 3 hours in a vacuum atmosphere.

14. The method of claim 12 wherein said cooling of step (d) occurs by gas cooling.

15. The method of claim 12 wherein the first aging treatment of step (e) is performed at about 1975° F. for about 4 hours.

16. The method of claim 15 wherein said first aging treatment is performed in an argon atmosphere.

17. The method of claim 12 wherein the second aging treatment of step (e) is performed at about 1600° F. for about 20 hours.

18. The method of claim 17 wherein said second aging treatment is performed in an argon or air atmosphere.

19. The method of claim 12 wherein said solution heat treatment of step (c) comprises solution heat treating the material two times.

20. The method of claim 19 wherein the material is (i) first subject to a solution heat treatment at a temperature of about 2330° F. for about 3 hours, (ii) rapidly cooled and then (iii) subject to a second solution heat treatment at a temperature of about 2350° F. for about 3 hours prior to step (d).

21. The method of claim 20 wherein the step of rapidly cooling the material as defined in (ii) occurs at a rate greater than about 120° F. per minute from said first solution temperature to about 1600° F.

22. The method of claim 21 wherein said rapid cooling occurs by gas cooling.

23. The method of claim 20 wherein said double aging heat treatment comprises first heat treating the material at a temperature of about 1975° F. for about 4 hours followed by heat treating the material at about 1600° F. for about 20 hours.

24. The method of claim 12 wherein said composition consists essentially of, by weight, about 4.0% to about 7.9% chromium; about 2.5% to about 5.0% cobalt; about 2.0% to about 6.0% molybdenum; about 5.0% to about 9.0% tungsten; about 2.5% to about 6.0% titanium; about 3.0% to about 6.0% aluminum; about 4.0% to about 9.0% tantalum; at least one element selected from the group consisting of from about 0.05% to about 0.5% hafnium and from 0.02% to about 0.3% silicon; about 0.05 up to about 0.4% of at least one element selected from the group consisting of yttrium and niobium; from about 0.2% to about 1.5% platinum; from about 0 to 0.3% boron, and the balance nickel.

* * * * *

UNITED STATES PATENT AND TRADEMARK OFFICE
CERTIFICATE OF CORRECTION

PATENT NO. : 5,077,141
DATED : December 31, 1991
INVENTOR(S) : Naik et al.

It is certified that error appears in the above-identified patent and that said Letters Patent is hereby corrected as shown below:

Col. 10, line 42, after "vanadium" insert --and niobium; from about 0.02 to about 3% platinum, from about 0 to about 1.0% boron, the balance nickel--.

Col. 12, line 54, after "yttrium" insert --and lanthanum; from about 1.0% to about 6.0% rhenium; from about 0.2% to about 1.5% of at least one element selected from the group consisting of vanadium--.

Signed and Sealed this

Sixth Day of July, 1993

Attest:

MICHAEL K. KIRK

Attesting Officer

Acting Commissioner of Patents and Trademarks